United States Patent [19]
Narahara

[11] Patent Number: 5,938,791
[45] Date of Patent: Aug. 17, 1999

[54] DEVICE FOR DETECTING MARGIN OF INFORMATION RECORDING AND REPRODUCING APPARATUS

[75] Inventor: Tatsuya Narahara, Kanagawa, Japan

[73] Assignee: Sony Corporation, Tokyo, Japan

[21] Appl. No.: 08/881,305

[22] Filed: Jun. 24, 1997

[30] Foreign Application Priority Data

Jul. 4, 1996 [JP] Japan ................................ P08-175197

[51] Int. Cl.$^6$ ..................................................... G06F 11/10
[52] U.S. Cl. ............................ 714/795; 714/796; 333/28; 379/41; 379/51; 379/67.1; 360/18; 360/26; 360/51; 360/27
[58] Field of Search .................................. 714/795, 43.8; 375/350; 360/51, 18, 22, 26, 27; 369/46, 59, 124; 333/28; 379/41, 51, 67.1

[56] References Cited

U.S. PATENT DOCUMENTS

| | | | |
|---|---|---|---|
| 4,646,173 | 2/1987 | Kammeyer et al. | 360/51 |
| 5,239,528 | 8/1993 | Narahara et al. | 369/44.18 |
| 5,363,412 | 11/1994 | Love et al. | 375/94 |
| 5,465,241 | 11/1995 | Narahara | 369/44.11 |
| 5,680,380 | 10/1997 | Taguchi et al. | 369/48 |

*Primary Examiner*—William Grant
*Assistant Examiner*—McDieunel Marc
*Attorney, Agent, or Firm*—Limbach & Limbach L.L.P.

[57] ABSTRACT

An information recording and reproducing apparatus provided with the maximum likelihood decoding utilizes a standard deviation of difference metrics as an estimating function for adjustment for the purpose of achieving a short-time adjustment with a small number of samples. A regenerative clock and a reproduction signal outputted from the information recording and reproducing apparatus are supplied to a maximum likelihood decoder. Based on the estimated recorded series detected by the maximum likelihood decoder at a low error rate, a recording state detector generates a recorded bit series. Then, a standard deviation calculator operates to select a difference metric delayed by a detected amount by a display line from the difference metrics outputted from the maximum likelihood decoder and derives the standard deviation of the difference metrics. Then, a $\sigma\_\Delta m/\mu\_\Delta m$ minimizing controller operates to adjust a shift of a sampling phase and a track offset of the information recording and reproducing apparatus so that the standard deviation $\sigma\_\Delta m$ is made minimal.

40 Claims, 9 Drawing Sheets

DEVICE FOR DETECTING MARGIN OF INFORMATION RECORDING AND REPRODUCING APPARATUS

BACKGROUND OF THE INVENTION

1. Field of the Invention

The present invention relates to an information recording and reproducing apparatus provided with a maximum likelihood decoding system such as Viterbi decoding system, and more particularly to a device for detecting a margin of the information recording and reproducing apparatus which device is arranged to detect a reproduction margin with a small number of samples.

2. Description of the Related Art

In general, an information recording and reproducing apparatus for sampling a reproduction signal from a recording medium at a channel clock and detecting the recorded information through the maximum likelihood decoding system such as the Viterbi decoding system has employed a reproduction error rate. The reproduction error rate is used for adjusting a shift of a sampling phase for detecting the recorded information, parameters of an equalizer, a track offset and so forth.

For executing various kinds of adjustments with such a reproduction error rate as an estimated value, the reproduction error rate is derived by recording a defined pattern of data and collating the detected pattern with the recorded pattern. The error rate may also be derived by pre-adding error detection information to the data before recording, reproducing, and detecting it, for deriving an error rate. Various kinds of adjusting values are set to reduce the error rate to a minimum value.

The, the foregoing conventional adjusting method for setting each adjusting value to reduce the reproduction error rate to a minimum value needs a large number of samples of a reproduction signal if a low error rate is required. Many samples need a long time to do the adjustment.

For example, if an error rate of $1\times10^{-9}$ is required, it is necessary to obtain the corresponding number of pieces of data for the error rate of $1\times10^{-9}$. This means at least $10^9$ symbols are required. For reproducing $10^9$ symbols, even at so high a symbol rate, e.g., 50 Msps=$5\times10^7$ sps (sps: symbol per second), 20 seconds are required. Hence, even if the adjustment is terminated at two error rate detections for one adjusting item, 40 seconds are needed for a reproduction time per one adjusting item. Totally, even the minimum necessary time is increased by a factor of the number of adjusting items.

As described above, the conventional method for adjusting various items with a reproduction error rate as the estimated value requires the reproduction of a massive amount of information for detecting the reproduction error rate. A long time is required for reproducing the massive amount of information, for the adjustment.

SUMMARY OF THE INVENTION

The present invention is made in consideration of solving the above problem, and it is an object of the present invention to provide a device for detecting a margin which is arranged to detect an estimated value for each adjusting item with a small number of samples.

The present invention is a device detects a margin of an information recording and reproducing apparatus. The apparatus for detecting recorded information through a maximum likelihood decoder based on a signal reproduced from a medium where information is recorded. The apparatus includes a detector for a recorded bit series having a minimal path of a Euclidean distance as a result of the maximum likelihood decoding; a subtracter for obtaining a difference of a likelihood between a path having a minimal Euclidean distance and reproduction signal series corresponding to the recorded bit series; and an operator for performing a statistical process of the difference.

The device for detecting a margin of the information recording and reproducing apparatus as described above is arranged to detect the estimated value for each adjusting item with a small number of samples, thereby setting an optimal adjusted value for a short time.

BRIEF DESCRIPTION OF THE DRAWINGS

This and other objects, features and advantages of the present invention will become more apparent upon a reading of the following detailed description and drawings, in which.

DESCRIPTION OF THE PREFERRED EMBODIMENTS

Figure 1:
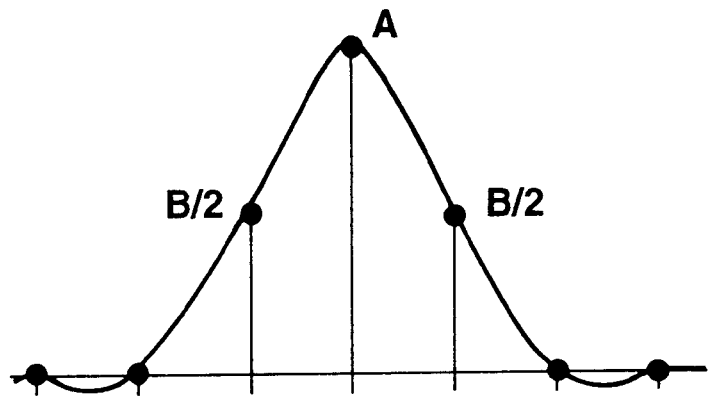
FIG. 1 is an explanatory view showing an example of a partial response characteristic.

An embodiment of the present invention will be discussed below with reference to the appended drawings. At first, the description will be oriented to a process for taking a difference of likelihood between paths each having a minimum Euclidean distance of reproduction signal series corresponding to the recorded bit series. Herein, the arrangement to be described is as follows. The recording/reproduction is executed in a partial response system. The partial response characteristic is selected as (B/2, A, B/2) as shown in FIG. 1 in the PRML (Partial-Response Maximum-Likelihood) for maximum likelihood decoding such as the Viterbi decoding. Then, a minimum run length is limited to 1 by using a Run Length Limited code such as a RLL (1, 7) code.

The state Sk defined by the recorded bit series $b_k \in (0, 1)$ at the k sampling time is made to be four states of S0, S1, S2, and S3 as listed in the following table 1.

TABLE 1

| State | Recorded bit | |
|---|---|---|
| $S_k$ | $b_{k-1}$ | $b_k$ |
| S0 | 0 | 0 |
| S1 | 0 | 1 |
| S2 | 1 | 1 |
| S3 | 1 | 0 |

Figure 2:
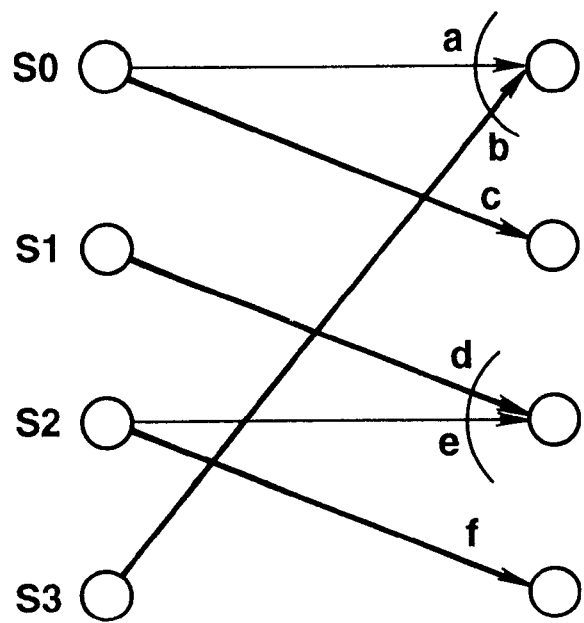
FIG. 2 is a trellis diagram showing a state transition.

Each state is transmitted to the next state according to the next recorded bit value. The state transition is shown in the trellis diagram of FIG. 2. In FIG. 2, a round mark indicates a state at each time point and an arrow mark indicates a state transition based on the recorded bit. The state transition indicated by the arrow mark is referred to as a branch. The letters a, b, c, d, e and f are assigned to the identifiers of the branches. The relation among each branch, a recorded bit series $b_k$, a previous state $S_{k-1}$, $S_k$ an expected value (noiseless output) $y_k$, and a branch metric $(z_k-Y_k)^2$ is listed in Table 2.

TABLE 2

| | Recorded bit | | | State | | Noiseless output | branch metric |
|---|---|---|---|---|---|---|---|
| Branch | $b_{k-2}$ | $b_{k-1}$ | $b_k$ | $S_{k-1}$ | $S_k$ | $y_k$ | $(z_k-y_k)^2$ |
| a | 0 | 0 | 0 | S0 | S0 | −A−B | $bma_k$ | $(z_k+A+B)^2$ |
| b | 1 | 0 | 0 | S3 | S0 | −A | $bmb_k$ | $(z_k+A)^2$ |
| c | 0 | 0 | 1 | S0 | S1 | −A | $bmc_k$ | $(z_k+A)^2$ |
| d | 0 | 1 | 1 | S1 | S2 | A | $bmd_k$ | $(z_k-A)^2$ |
| e | 1 | 1 | 1 | S2 | S2 | A+B | $bme_k$ | $(z_k-A-B)^2$ |
| f | 1 | 1 | 0 | S2 | S3 | A | $bmf_k$ | $(z_k-A)^2$ |

The expected value $y_k$ signifies an output to the recorded bit series bk of an ideal reproduction channel with no noise or distortion and is determined by the following expression (1).

$$Y_k = B/2 b'_{k-2} + A b'_{k-1} + B/2 b'_k \quad (1)$$

wherein $b'_k$ means an assigned value of 0 of $b_k$ to −1 and 1. The branch metric $(z_k-y_k)^2$ means a quantity representing a difference between an actual reproduced series $z_k$ and the expected value $y_k$ of each branch and is termed $bma_k$, $bmb_k$, and so forth by adding the index of each branch to the branch metric. FIG. 2 and Table 2 do not contain a branch corresponds to an inhibit pattern {. . . 0, 1, 0 . . . } and {. . .1, 0, 1 . . .} if the minimum run length is limited to 1.

The Viterbi decoding is executed to select the branches a, b and d, e meeting the states S0 an S2 shown in FIG. 2 at each sample. The states S1 and S3 contain the branches c and f left without any selection. As a result, the recorded bit series corresponding to a series of paths left without any punctuation as the actual recorded bit series.

The selecting condition is listed in Table 3.

TABLE 3

| State | Add branch metric and compare | Selected branch | Selected metric | | Decoded bit | |
|---|---|---|---|---|---|---|
| | | | | | $a_{k-1}$ | $b_{k-1}$ |
| $S0_k$ | $(m0_{k-1}+bma_k)$ $\leq (m3_{k-1}+bmb_k)$ | a | $m0_k$ | $m0_{k-1}+bma_k$ | 0 | 0 |
| | $(m0_{k-1}+bma_k)$ $> (m3_{k-1}+bmb_k)$ | b | | $m3_{k-1}+bmb_k$ | 0 | 0 |
| $S1_k$ | $m0_{k-1}+bmc_k$ | c | $m1_k$ | $m0_{k-1}+bmc_k$ | 1 | 1 |
| $S2_k$ | $(m1_{k-1}+bmd_k)$ $\leq (m2_{k-1}+bme_k)$ | d | $m2_k$ | $m1_{k-1}+bmd_k$ | 0 | 1 |
| | $(m1_{k-1}+bmd_k)$ $> (m2_{k-1}+bme_k)$ | e | | $m2_{k-1}+bme_k$ | 0 | 1 |
| $S3_k$ | $m2_{k-1}+bmf_k$ | f | $m3_k$ | $m2_{k-1}+bmf_k$ | 1 | 0 |

The matrix $m0_{k-1}$ is an accumulative value of the branch metrics of the paths left in the state S0 at a k−1 sample. At the k sample, a smaller one of the metrics is selected from the branches a and b and is assumed to be $m0_k$. The value of $m0_k$ is used for the selection at the next k+1 sample. In the state S2, the similar process is executed. In the states S1 and S3, the limitation of the minimum run length makes it possible to take over the metrics in the states S0 and S2 as shown in FIG. 2 without any selection.

The metric given by selecting the path corresponding to the ideal recorded bit series of N bits without any error is represented by the following expression.

$$mx_k = \sum_{K=0}^{N-1} (Z_{n-k} - y_{n-k})^2 \quad (2)$$

wherein $y_k$ is a real expected value series corresponding to the real recording series. Assuming that it is an N-degree vector $\{y_k\}$, it corresponds to a square value of a Euclidean distance from the actual input vector $\{z_k\}$.

The foregoing selection is executed to reduce the metric of the left path to a minimum. Hence, $mx_k$ is a minimal value. It means that the path of the shortest distance to the recorded bit series vector remains. It is obvious from the expression (2) that if the real reproduced bit series $z_k$ coincides with the real expected bit series $y_k$ corresponding to the real recorded bit series, a value of 0 is taken, while if even one coincidence exists, a value of non-zero is taken.

In this Viterbi decoding, if an error takes place, a path is erroneously selected. Hence, if the state of the recorded bit series at the k sample is S0, it means that the branch b: S3→S0 is selected though the correct transition is the branch a: S0→S0. This is the case of $$m3_{k-1}+bmb_k-(m0_{k-1}+bma_k)<0$$

Conversely, if the state if the recorded bit series is S3, an error takes place when $$m0_{k-1}+bma_k-(m3_{k-1}+bmb_k) \leq 0$$

The difference is assumed as a difference metric $\Delta m_k$. The states are set as listed in Table 4 so that a negative value is taken when an error takes place in each transition.

TABLE 4

| State | Difference metric $\Delta m_k$ | Selected branch | Selected metric | | Decoded bit $a_k$ | $b_k$ |
|---|---|---|---|---|---|---|
| $S0_k$ | $m3_{k-1}+bmb_k$ $-m0_{k-1}-bma_k$ | a | $m0_k$ | $m0_{k-1}+bma_k$ | 0 | 0 |
| | $m0_{k-1}+bma_k$ $-m3_{k-1}-bmb_k$ | b | | $m3_{k-1}+bmb_k$ | 0 | 0 |
| $S1_k$ | *** | c | $m1_k$ | $m0_{k-1}+bmc_k$ | 1 | 1 |
| $S2_k$ | $m2_{k-1}+bme_k$ $-m1_{k-1}-bmd_k$ | d | $m2_k$ | $m1_{k-1}+bmd_k$ | 0 | 1 |
| | $m1_{k-1}+bmd_k$ $-m2_{k-1}-bme_k$ | e | | $m2_{k-1}+bme_k$ | 0 | 1 |
| $S3_k$ | *** | f | $m3_k$ | $m2_{k-1}+bmf_k$ | 1 | 0 |

The correct recorded bit series are synchronized with the reproduced bit series $z_k$ as a decoded result or by a synchronous signal. Then, by obtaining a difference metric $\Delta m_k$ according to each of the recorded series, the error is more difficult to take place as the distribution is more off in the positive direction.

This distribution reflects a variety of reproduction signal amplitudes. On many mediums, the noise may bring about this variety, so that the distribution indicates a normal distribution with an average value as a center. If the average value is $\mu$ and the standard deviation is $\sigma$, a probability density distribution function is represented by the following expression.

$$\exp\{-(x-\mu^2)/2\sigma^2\} \quad (3)$$

The probability of taking a negative value is represented by the following expression (4)

$$prob(\Delta m < 0) = \frac{1}{2\sigma} \int_0^{-\infty} \exp\{-(x-\mu^3)/2\sigma^2\} dx \quad (4)$$

Figure 3:
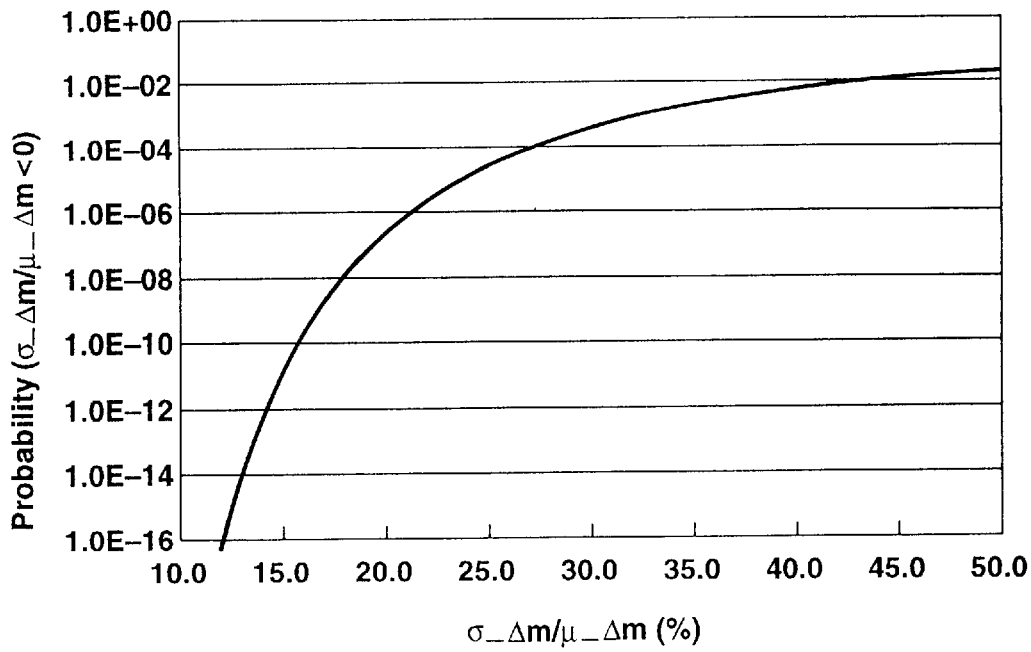
FIG. 3 is a graph showing a relation between a probability of a standard deviation of a difference metric divided by an average of a difference metric.

If the average value $\mu\_\Delta m$ and the standard deviation $\sigma\_\Delta m$ of the difference metrics $\Delta m_k$ are grasped from FIG. 3, by reducing $\mu\_\Delta m\ and\ \sigma\_\Delta m$ to a minimum, the minimization of an error rate is made possible.

If the difference metrics in S0 and S2 are used for all the reproduced series, the distance from the worst path is made variable according to the pattern. As a result, the resulting distribution is made to be a set of distributions with an average value equal to the center value of another sort, which is different from the normal distribution and is made to have a smaller correlation between $\mu\_\Delta m$ and $\sigma\_\Delta m$ and an error rate.

Figure 4:
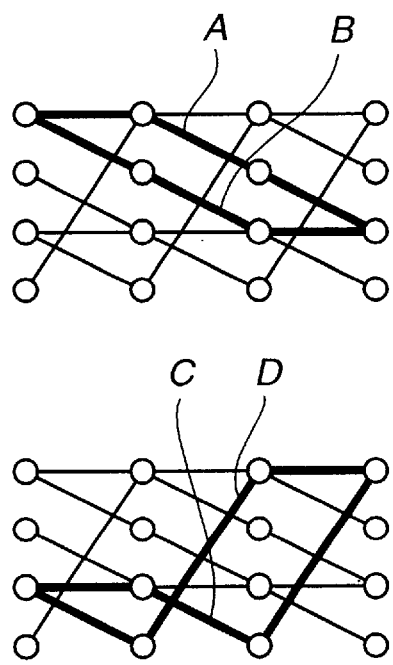
FIG. 4 is a trellis diagram showing a trellis for keeping a distance between two paths each having a high probability of taking a negative value as the difference metric to a minimal value.

Hence, it is necessary to select from the recorded bit series the paths with the highest probability of taking a negative value of Am having a minimal distance therebetween. These paths are a pair of paths which are branched from a certain state and meet with each other at an early stage. In this description, two pairs of paths, that is, four paths as shown in FIG. 4 may be referred to. If this is represented by the state transition, it is represented as follows.

TABLE 5

| Recorded path | State | | | | Critical path |
|---|---|---|---|---|---|
| | $S_{k-3}$ | $S_{k-2}$ | $S_{k-1}$ | $S_k$ | |
| A | S0 | S0 | S1 | S2 | B |
| B | S0 | S1 | S2 | S2 | A |
| C | S2 | S2 | S3 | S0 | D |
| D | S2 | S3 | S0 | S0 | C |

In a case that the recorded state at the k sample is S2, the state at the one previous sample is S1, the state at the two previous samples is S0, and the state at the three previous samples is S0, $\Delta m$ is operated according to the Table 4 for deriving the average value and the standard deviation so that the branch A is selected at the state S0.

Figure 5:
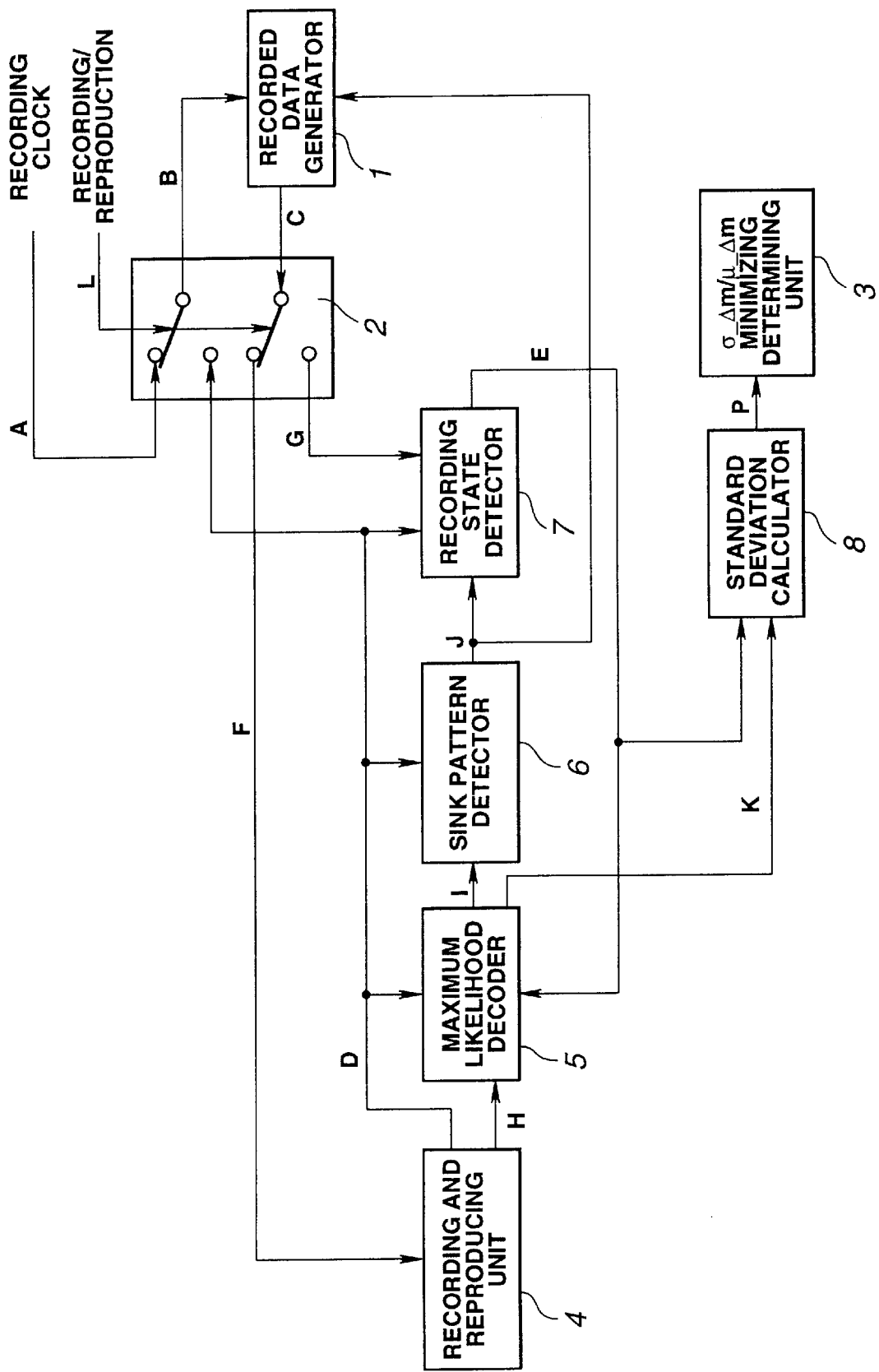
FIG. 5 is a block diagram showing a device for detecting a margin of an information recording and reproducing apparatus according to an embodiment of the present invention.

FIG. 5 is a block diagram showing a device for detecting a margin of the information recording and reproducing apparatus according to an embodiment of the present invention. In FIG. 5, recorded bit series $b_kF$ are inputted to a recorded data generator 1 together with a recording clock A through a switch 2 and then written on a medium through the effect of a recording and reproducing unit 4. In reproducing the data, a reproduction clock D synchronized with a reproduction signal of a pattern written on the medium and a reproduction signal H sampled at the reproduction clock D are input to a maximum likelihood decoder 5 such as a Viterbi decoder. The binary information bit I detected by the maximum likelihood decoder 5 is supplied to a sink pattern detector 6. The sink pattern detector 6 detects a sink pattern portion. Based on a timing signal J of the sink pattern output from the sink pattern detector 6, the recorded data generator 1 takes synchronization with a result of calculating a metric K inside of the maximum likelihood decoder 5. Based on the recorded data, state series E are generated. Inside of a standard deviation calculator 8, the difference metrics at the crosspoints of two pairs of paths, that is, four paths shown in FIG. 4, are selected and then the average value and the standard deviation thereabout are calculated. By dividing the standard deviation a value obtained by the average value, $\sigma\_\Delta m/\mu\_\Delta m$, is output. The value of $\sigma_{13}\ \Delta m/\mu\_\Delta m$ output from the standard deviation difference calculator 8 is supplied to a $\sigma\_\Delta m/\mu\_\Delta m$ minimization determining unit 3.

Figure 6:
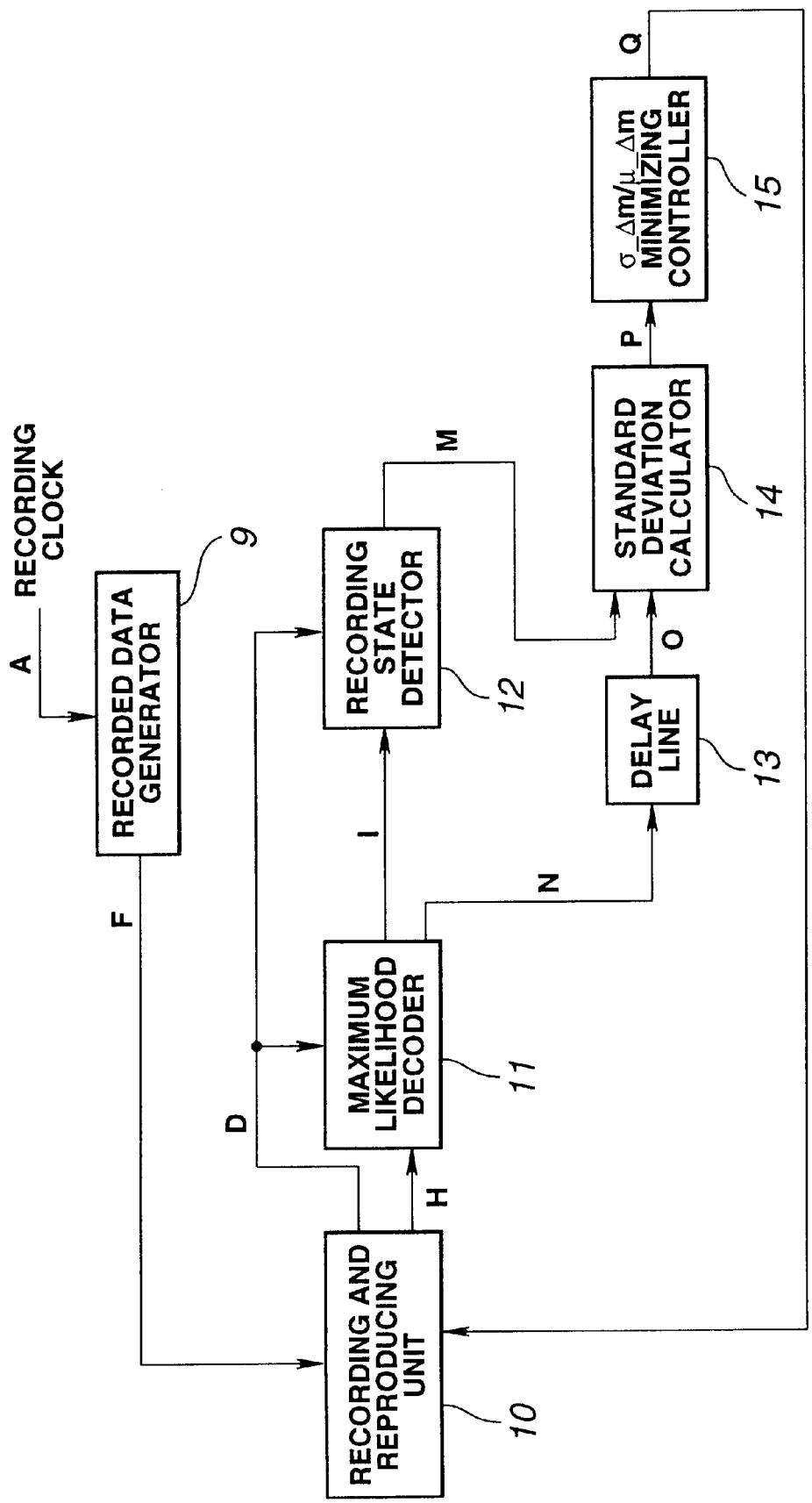
FIG. 6 is a block diagram showing a device for detecting a margin of an information recording and reproducing apparatus according to another embodiment of the present invention.

FIG. 6 is a block diagram showing a device for detecting a margin of the information recording and reproducing apparatus according to another embodiment of the present invention. FIG. 5 shows an arrangement for detecting a difference metric with a defined recording pattern. On the other hand, the device for detecting a margin shown in FIG. 6 may apply to an optical ROM disk which has difficulty in fixing a repetitive pattern. In this margin detecting device, recorded state series M are generated by a recorded state detector 12 from the estimated recorded bit series I detected by the maximum likelihood decoder 11 at a low error rate. Then, a standard deviation calculator 14 operates to select difference metrics O obtained by delaying the difference metric N output from the maximum likelihood decoder 11 by the detected amount through the effect of a delay line 13, for deriving a standard deviation of the selected metrics O.

The arrangements shown in FIGS. 5 and 6 each provide the maximum likelihood decoder and the like as an estimator arranged outside of the recording and reproducing unit. Part or all of these detecting systems are provided inside of the recording and reproducing unit so that an automatic adjusting loop for minimization is arranged on the basis of the detected value $\sigma\_\Delta m/\mu\_\Delta m$ of the spread of the distribution of the difference metrics.

Figure 7:
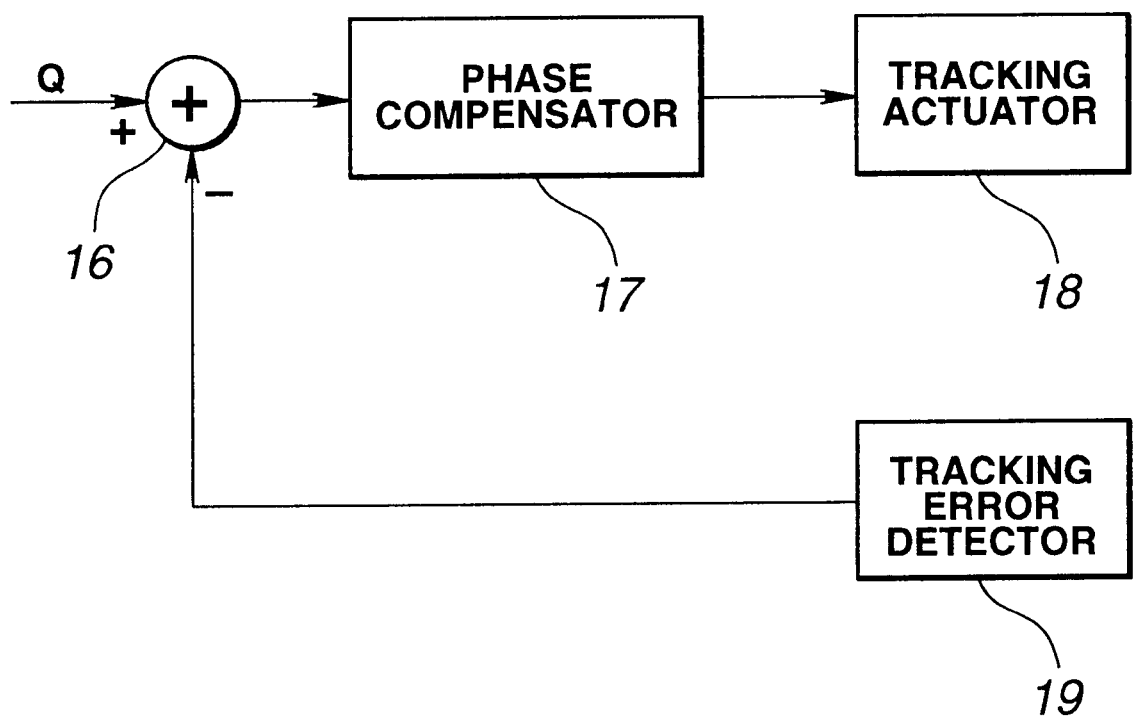
FIG. 7 is a block diagram showing a circuit for adjusting a tracking offset provided inside of an automatic recording and reproducing unit shown in FIG. 6.

The automatic adjusting loop will be discussed below with an example of an automatic adjustment of a tracking offset. FIG. 7 shows a circuit for adjusting a tracking offset provided in the automatic recording and reproducing unit 10 shown in FIG. 6. A tracking error corresponding to a shift from a track center is detected by a tracking error detector 19, and a difference between the tracking error and a tracking servo offset voltage Q is obtained by an adder 16. The added output from the adder 16 is supplied to a phase compensator 17 in which a response characteristic is compensated in phase. After that, the compensated output is supplied as a control signal to a tracking actuator 18. This control signal serves to control the location of a reproduction spot (reproducing head) in proportion to the tracking servo offset voltage Q.

Figure 8:
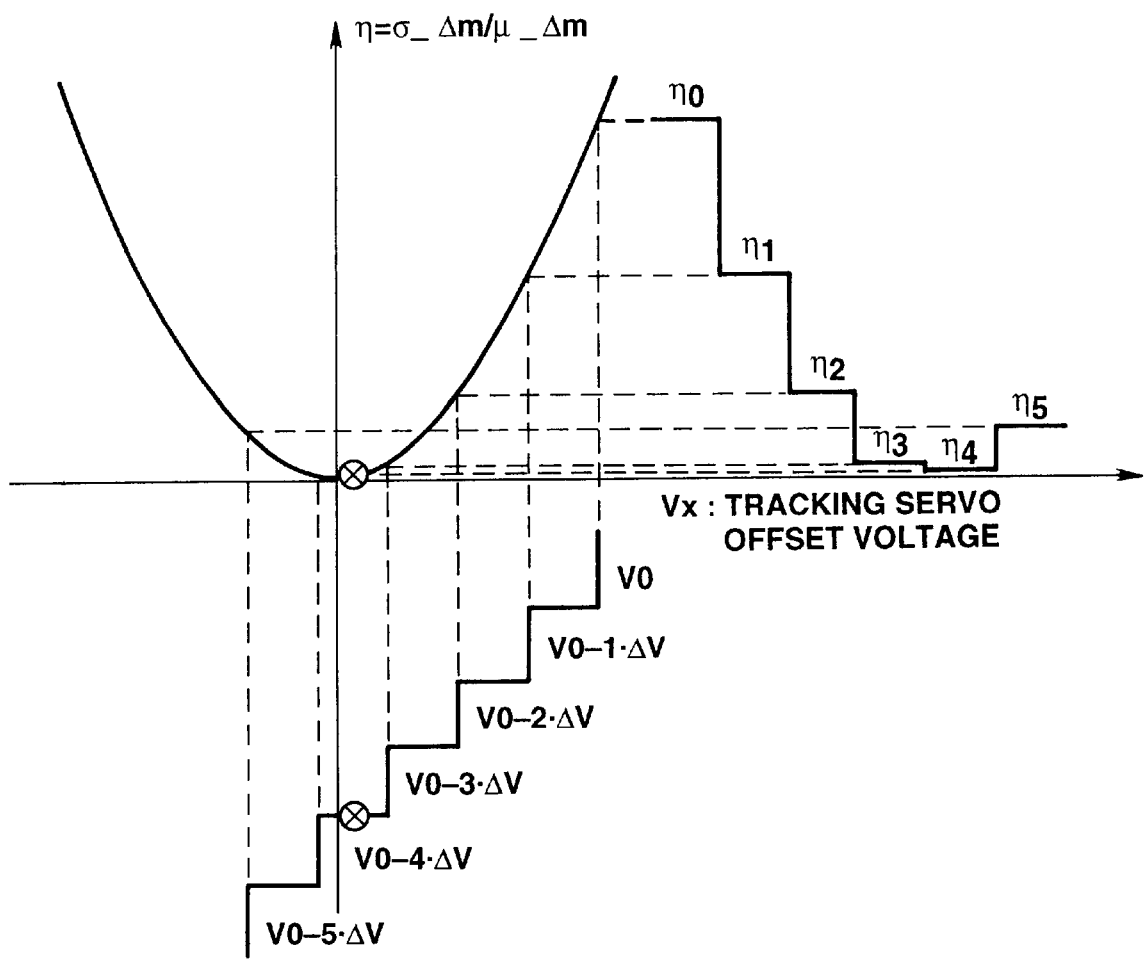
FIG. 8 is a graph showing a relation between a tracking servo offset voltage and a standard deviation of the difference metric.

The relation between the tracking servo offset voltage Q and the standard deviation of the difference metrics is shown in FIG. 8. In FIG. 8, the tracking servo offset voltage Q is indicated as a tracking servo offset voltage Vx and the detected value ($\sigma\_\Delta m/\mu\_\Delta m$) of the spread of the standard deviation of the difference metrics is indicated as $\eta$.

If the reproduction spot (reproducing head) is shifted from the center of the track, crosstalk from the adjacent tracks is increased so that an SN ratio (SNR) of the reproduction signal is decreased accordingly. Further, the standard deviation $\sigma\_\Delta m$ of the difference metrics is increased and the detected value $\eta$ of the spread of the standard deviation of the difference metrics is increased accordingly. Since the adjacent tracks are located on both sides of the object track, as shown in FIG. 8, an even symmetric curve with a minimum point appears.

Figure 9:
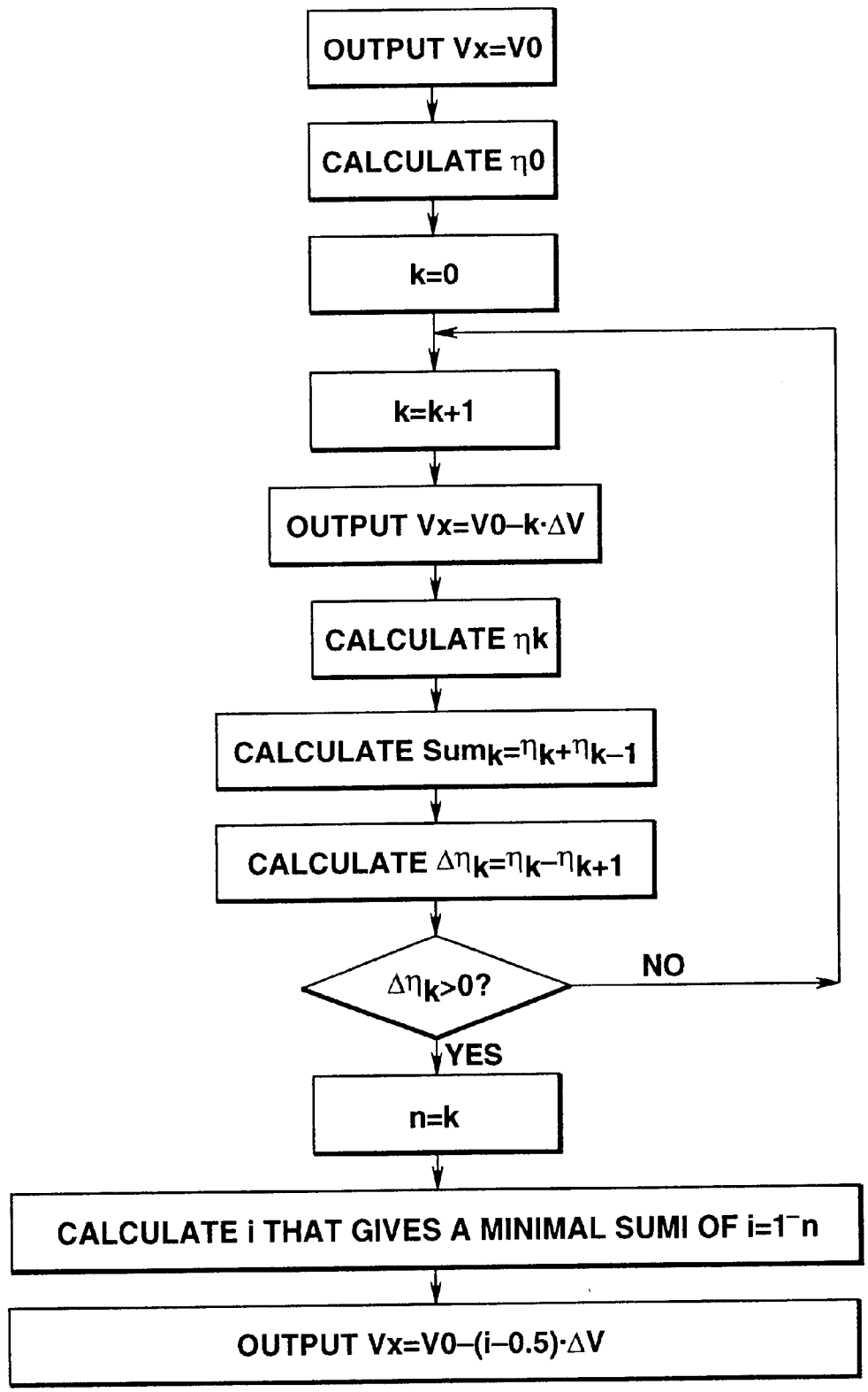
FIG. 9 is a flowchart showing an algorithm for automatically adjusting a track offset in a manner to reduce spread of a distribution of a standard deviation of a difference metric to a minimum.

FIG. 9 shows an algorithm for defining Vx for providing a minimum $\eta$. A variation $\Delta V$ is sequentially decreased until $\eta$ is increased from the initial value V0. By storing $\text{Sum}_i$ and determining the sample for bringing about a minimum $\text{Sum}_i$ and the tracking servo offset voltage Q shown in FIGS. 6 and 7 with a midpoint of the previous $\text{Sum}_i$ as Vx, $\eta$ can be minimized. The variation $\Delta V$ is just required to set to a lower value than a doubled potential corresponding to a regulated track offset error.

Figure 10:
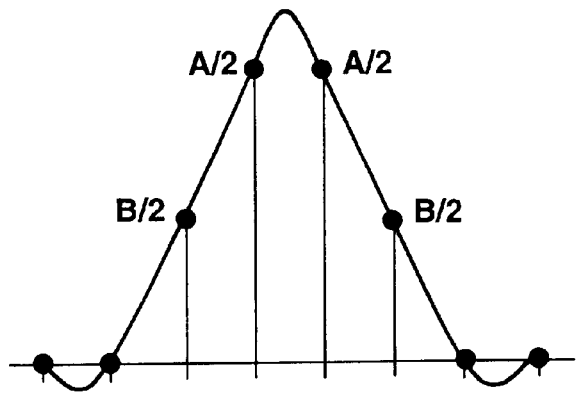
FIG. 10 is an explanatory view showing another example of a partial response characteristic.
Figure 11:
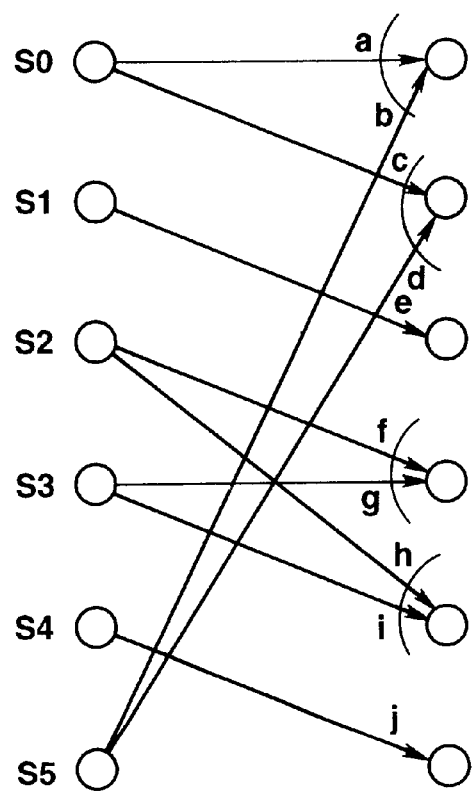
FIG. 11 is a trellis diagram showing a state transition.
Figure 12:
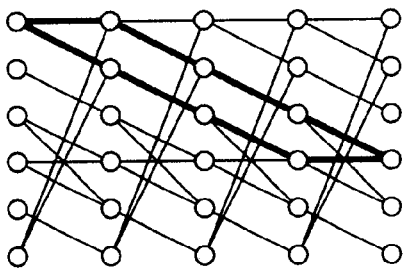
FIG. 12 is a trellis diagram showing a trellis for keeping a distance between two paths each having a high probability of taking a negative value as a difference metric to a minimal value.
Figure 12:
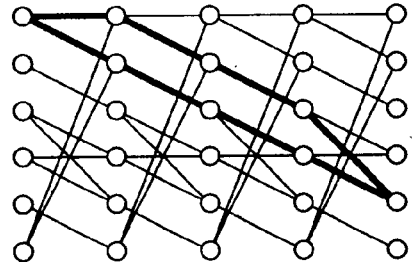
Figure 12:
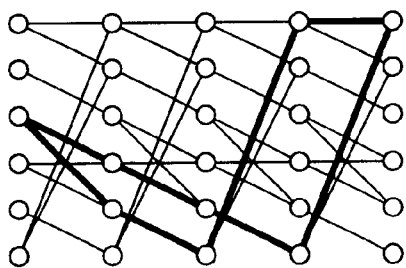
Figure 12:
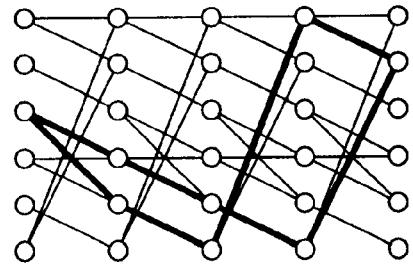
Figure 12:
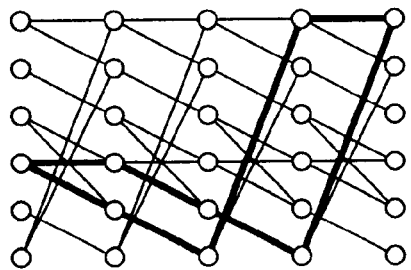
Figure 12:
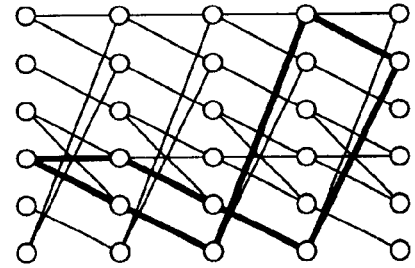
Figure 12:
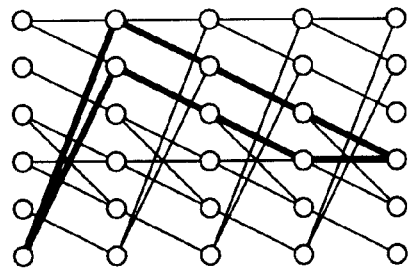
Figure 12:
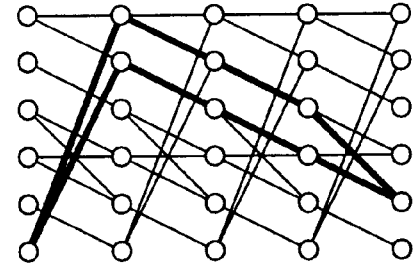

The process for the difference metric has been discussed on the arrangement wherein the waveform interference (ISI) has three widths and one minimum run length is provided. The same process may apply to patterns with a minimum Euclidean distance in the PRML system wherein the waveform interference (ISI) has N (2 or more) widths and zero or more minimum run lengths are provided. As an example, the diagrams of the arrangement where the waveform interference (ISI) has four widths, which correspond to FIGS. 1, 2 and 3, are illustrated in FIGS. 10, 11 and 12. The tables of the arrangement, which correspond to the tables 1 to 5, are listed in Tables 6 to 10.

TABLE 6

| State | Recorded bit | | |
|---|---|---|---|
| $S_k$ | $b_{k-2}$ | $b_{k-1}$ | $b_k$ |
| S0 | 0 | 0 | 0 |
| S1 | 0 | 0 | 1 |
| S2 | 0 | 1 | 1 |
| S3 | 1 | 1 | 1 |
| S4 | 1 | 1 | 0 |
| S5 | 1 | 0 | 0 |

TABLE 7

| Branch | Recorded bit | | | | State | | Noiseless output | branch metric |
|---|---|---|---|---|---|---|---|---|
| | $b_{k-3}$ | $b_{k-2}$ | $b_{k-1}$ | $b_k$ | $S_{k-1}$ | $S_k$ | $y_k$ | $(z_k - y_k)^2$ |
| a | 0 | 0 | 0 | 0 | S0 | S0 | −A−B | $bma_k$ $(z_k+A+B)^2$ |
| b | 1 | 0 | 0 | 0 | S5 | S0 | −A | $bmb_k$ $(z_k+A)^2$ |
| c | 0 | 0 | 0 | 1 | S0 | S1 | −A | $bmc_k$ $(z_k+A)^2$ |
| d | 1 | 0 | 0 | 1 | S5 | S1 | −A+B | $bmd_k$ $(z_k+A−B)^2$ |
| e | 0 | 0 | 1 | 1 | S1 | S2 | 0 | $bme_k$ $(z_k-0)^2$ |
| f | 0 | 1 | 1 | 1 | S2 | S3 | A | $bmf_k$ $(z_k-A)^2$ |
| g | 1 | 1 | 1 | 1 | S3 | S3 | A+B | $bmg_k$ $(z_k-A-B)^2$ |
| h | 0 | 1 | 1 | 0 | S2 | S4 | A−B | $bmh_k$ $(z_k-A+B)^2$ |
| i | 1 | 1 | 1 | 0 | S3 | S4 | A | $bmi_k$ $(z_k-A)^2$ |
| j | 1 | 1 | 0 | 0 | S4 | S5 | 0 | $bmj_k$ $(z_k-0)^2$ |

TABLE 8

| State $S_k$ | Add branch metric and compare | Selected branch | Selected metric | Decoded bit $a_k$ | $b_k$ |
|---|---|---|---|---|---|
| S0 | $(m0_{k-1}+bma_k) \leq (m5_{k-1}+bmb_k)$ | a | $m0_k$ | $m0_{k-1}+bma_k$ | 0 | 0 |
| | $(m0_{k-1}+bma_k) > (m5_{k-1}+bmb_k)$ | b | | $m5_{k-1}+bmb_k$ | 0 | 0 |
| S1 | $(m0_{k-1}+bmc_k) \leq (m5_{k-1}+bmd_k)$ | c | $m1_k$ | $m0_{k-1}+bmc_k$ | 1 | 1 |
| | $(m0_{k-1}+bmc_k) > (m5_{k-1}+bmd_k)$ | d | | $m5_{k-1}+bmd_k$ | 1 | 1 |
| S2 | $m1_{k-1}+bme_k$ | e | $m2_k$ | $m1_{k-1}+bme_k$ | 0 | 1 |
| S3 | $(m2_{k-1}+bmf_k) \leq (m3_{k-1}+bmg_k)$ | f | $m3_k$ | $m2_{k-1}+bmf_k$ | 0 | 1 |
| | $(m2_{k-1}+bmf_k) > (m3_{k-1}+bmg_k)$ | g | | $m3_{k-1}+bmg_k$ | 0 | 1 |
| S4 | $(m2_{k-1}+bmh_k) \leq (m3_{k-1}+bmi_k)$ | h | $m4_k$ | $m2_{k-1}+bmh_k$ | 1 | 0 |
| | $(m2_{k-1}+bmh_k) > (m3_{k-1}+bmi_k)$ | i | | $m3_{k-1}+bmi_k$ | 1 | 0 |
| S5 | $m4_{k-1}+bmj_k$ | j | $m5_k$ | $m4_{k-1}+bmj_k$ | 0 | 0 |

TABLE 9

| State $S_k$ | Add branch metric and compare | Selected branch | Selected metric | Decoded bit $a_k$ | $b_k$ |
|---|---|---|---|---|---|
| S0 | $m5_{k-1}+bmb_k-m0_{k-1}-bma_k$ | a | $m0_k$ | $m0_{k-1}+bma_k$ | 0 | 0 |
| | $m0_{k-1}+bma_k-m5_{k-1}-bmb_k$ | b | | $m5_{k-1}+bmb_k$ | 0 | 0 |
| S1 | $m5_{k-1}+bmd_k-m0_{k-1}-bmc_k$ | c | $m1_k$ | $m0_{k-1}+bmc_k$ | 1 | 1 |
| | $m0_{k-1}+bmc_k-m5_{k-1}-bmd_k$ | d | | $m5_{k-1}+bmd_k$ | 1 | 1 |
| S2 | *** | e | $m2_k$ | $m1_{k-1}+bme_k$ | 0 | 1 |
| S3 | $m3_{k-1}+bmg_k-m2_{k-1}-bmf_k$ | f | $m3_k$ | $m2_{k-1}+bmf_k$ | 0 | 1 |
| | $m2_{k-1}+bmf_k-m3_{k-1}-bmg_k$ | g | | $m3_{k-1}+bmg_k$ | 0 | 1 |
| S4 | $m3_{k-1}+bmi_k-m2_{k-1}-bmh_k$ | h | $m4_k$ | $m2_{k-1}+bmh_k$ | 1 | 0 |
| | $m2_{k-1}+bmh_k-m3_{k-1}-bmi_k$ | i | | $m3_{k-1}+bmi_k$ | 1 | 0 |
| S5 | *** | j | $m5_k$ | $m4_{k-1}+bmj_k$ | 0 | 0 |

TABLE 10

| Recorded path | State | | | | | Critical path |
|---|---|---|---|---|---|---|
| | $S_{k-4}$ | $S_{k-3}$ | $S_{k-2}$ | $S_{k-1}$ | $S_k$ | |
| A | S0 | S0 | S1 | S2 | S3 | B |
| B | S0 | S1 | S2 | S3 | S3 | A |
| C | S0 | S0 | S1 | S2 | S4 | D |
| D | S0 | S1 | S2 | S3 | S4 | C |
| E | S2 | S3 | S4 | S5 | S0 | F |
| F | S2 | S4 | S5 | S0 | S0 | E |
| G | S2 | S3 | S4 | S5 | S1 | H |
| H | S2 | S4 | S5 | S0 | S1 | G |
| I | S3 | S3 | S4 | S5 | S0 | J |
| J | S3 | S4 | S5 | S0 | S0 | I |
| K | S3 | S3 | S4 | S5 | S1 | L |
| L | S3 | S4 | S5 | S0 | S1 | K |
| M | S5 | S0 | S1 | S2 | S3 | N |
| N | S5 | S1 | S2 | S3 | S3 | M |
| O | S5 | S0 | S1 | S2 | S4 | P |
| P | S5 | S1 | S2 | S3 | S4 | O |

In addition, the same process may apply to patterns with the minimum Euclidean distance of the trellis-coded difference metrics as well.

As set forth above, according to the present invention, each information recording and reproducing apparatus operates to obtain a difference of a likelihood between the paths whose Euclidean distance is minimal, perform a statistical process of the difference, and set the most approximate adjusted value for obtaining a low error rate with a small number of samples. As compared with the prior art, the present invention shortens the adjusting time and thereby enhances the general characteristic of the system. Further, if a partial defect of a medium limits a minimal value of the error rate, the present invention enables to adjust the characteristic to the value corresponding to a lower error rate, thereby enhancing the general characteristic. Further, the present invention provides a capability of automatically adjusting the characteristic into the value corresponding to the lower error rate through the effect of the information recording and reproducing apparatus, which leads to enhancing the general characteristic.

Many widely different embodiments of the present invention may be constructed without departing from the spirit and scope of the present invention. It should be understood that the present invention is not limited to the specific embodiments described in the specification, except as defined in the appended claims.

What is claimed is:

1. A device for detecting a margin of an information recording and reproducing apparatus, said device for detecting recorded information through a maximum likelihood decoder based on a signal reproduced from a medium where information is recorded, comprising:
   a detector for a recorded bit series having a minimal path of a Euclidean distance as a result of maximum likelihood decoding;
   a subtracter for obtaining a difference of a likelihood between a path having a minimal Euclidean distance and a reproduction signal series corresponding to said recorded bit series; and
   an operator for performing a statistical process on said difference.

2. The device according to claim 1, wherein the maximum likelihood decoding comprises Viterbi decoding.

3. The device according to claim 1, wherein the reproduction signal series comprises a series of states wherein each state is selected based upon a plurality of bits in said recorded bit series.

4. The device according to claim 1, wherein the operator for performing a statistical process on said difference generates a detected value used to control tracking, wherein the detected value is determined based upon a standard deviation of said difference and an average value of said difference.

5. The device according to claim 4, further comprising a tracking actuator operationally coupled with the operator for performing a statistical process wherein the tracking actuator controls the location of a reproducing head based upon the detected value.

6. The device according to claim 1, wherein the operator for performing a statistical process on said difference calculates a standard deviation of said difference and an average value of said difference, and then divides the standard deviation by the average value to provide a detected value used to control tracking.

7. The device according to claim 6, further comprising a tracking actuator operationally coupled with the operator for performing a statistical process wherein the tracking actuator controls the location of a reproducing head based upon the detected value.

8. An apparatus for detecting recorded information comprising:
   a detector configured to generate a reproduction signal based upon a pattern written on a recording medium;
   a maximum likelihood decoder operationally coupled with the detector and configured to generate a bit series based upon the reproduction signal;
   a sink pattern detector operationally coupled with the maximum likelihood decoder and configured to detect a sink pattern in the bit series;
   a state detector operationally coupled with the maximum likelihood decoder and the sink pattern detector and configured to generate a state series;
   a calculator operationally coupled with the state detector and configured to generate a standard deviation of a difference metric and an average value of the difference metric, wherein the calculator further divides the standard deviation by the average value to provide a detected value; and
   a tracking actuator operationally coupled with the calculator and configured to minimize tracking errors in response to the detected value.

9. The apparatus according to claim 8, wherein the maximum likelihood decoder comprises a Viterbi decoder configured to generate a bit sequence having a minimum Euclidean distance.

10. The apparatus according to claim 8, wherein the state detector selects a state based upon at least two bits in the bit series.

11. The apparatus according to claim 8, further comprising a tracking controller operationally coupled between the calculator and the tracking actuator and configured to generate a tracking voltage based upon the detected value and an even curve.

12. The apparatus according to claim 11, wherein the even curve is symmetric.

13. The apparatus according to claim 12, further comprising a reproducing head operationally coupled with the tracking actuator wherein the tracking actuator automatically adjusts the physical location of the reproducing head.

14. The apparatus according to claim 13 further comprising a recording unit.

15. An apparatus for detecting recorded information comprising:

a maximum likelihood decoder configured to generate a bit series based upon a reproduction signal;

a state detector operationally coupled with the maximum likelihood decoder and configured to generate a state series;

a calculator operationally coupled with the state detector and the maximum likelihood decoder and configured to generate a standard deviation and an average value; and a tracking controller operationally coupled with the calculator and configured to generate a tracking signal operative to control a tracking actuator.

16. The apparatus according to claim 15, wherein the maximum likelihood decoder comprises a Viterbi decoder configured to generate the bit series having a minimal Euclidean distance.

17. The apparatus according to claim 16, wherein the state detector selects a state based upon at least two bits in the bit series.

18. The apparatus according to claim 17, wherein the calculator is configured to generate the standard deviation and the average value based upon a difference between the bit series and the state series, and wherein the calculator divides the standard deviation by the average value to provide a detected value.

19. The apparatus according to claim 18, wherein the tracking controller is configured to generate the tracking signal based upon the detected value and an even symmetric curve.

20. The apparatus according to claim 19, further comprising a tracking actuator operationally coupled with the tracking controller and configured to automatically adjust the physical location of a reproducing head.

21. A method for detecting a margin of an information recording and reproducing apparatus, wherein said method detects recorded information through a maximum likelihood decoder based on a signal reproduced from a medium where information is recorded, comprising:

detecting a recorded bit series having a minimal path of a Euclidean distance as a result of maximum likelihood decoding;

obtaining a difference of a likelihood between a path having a minimal Euclidean distance and a reproduction signal series corresponding to saii recorded bit series; and performing a statistical process on said difference.

22. The method according to claim 21, wherein the maximum likelihood decoding comprises Viterbi decoding.

23. The method according to claim 21, wherein the reproduction signal series comprises a series of states wherein each state is selected based upon a plurality of bits in said recorded bit series.

24. The method according to claim 21, wherein the step of performing a statistical process on said difference generates a detected value used to control tracking, wherein the detected value is determined based upon a standard deviation of said difference and an average value of said difference.

25. The method according to claim 24, further comprising controlling the location of a reproducing head based upon the detected value.

26. The method according to claim 21, wherein the step of performing a statistical process on said difference calculates a standard deviation of said difference and an average value of said difference, and then divides the standard deviation by the average value to provide a detected value used to control tracking.

27. The method according to claim 26, further comprising controlling the location of a reproducing head based upon the detected value.

28. A method for detecting recorded information comprising:

generating a reproduction signal based upon a pattern written on a recording medium;

generating a bit series based upon the reproduction signal;

detecting a sink pattern in the bit series;

generating a state series based upon the bit series;

generating a standard deviation of a difference metric and an average value of the difference metric, and dividing the standard deviation by the average value to provide a detected value; and controlling a tracking actuator based upon the detected value.

29. The method according to claim 28, wherein the step of generating a bit series comprises generating a bit series having a minimum Euclidean distance.

30. The method according to claim 28, wherein in the step of generating a state series a state is selected based upon at least two bits in the bit series.

31. The method according to claim 28, further comprising the step of generating a tracking voltage based upon the detected value and an even curve.

32. The method according to claim 31, wherein the even curve is symmetric.

33. The method according to claim 32, further comprising the step of automatically adjusting the physical location of a reproducing head based upon the tracking voltage.

34. The method according to claim 33 further comprising recording a data pattern on a recording medium.

35. A method for detecting recorded information comprising:

generating a bit series based upon a reproduction signal;

generating a state series based upon the bit series;

generating a standard deviation and an average value based upon the bit series; and generating a tracking signal operative to control a tracking actuator based upon the standard deviation and the average value.

36. The method according to claim 35, wherein in the step of generating a bit series, the bit series has a minimal Euclidan distance.

37. The method according to claim 36, wherein in the step of generating a state series, a state is selected based upon at least two bits in the bit series.

38. The method according to claim 37, wherein in the step of generating a standard deviation and an average value, the standard deviation and the average value are based upon a difference between the bit series and the state series, and wherein the standard deviation is divided by the average value to provide a detected value.

39. The method according to claim 38, wherein the tracking signal is generated based upon the detected value and an even symmetric curve.

40. The apparatus according to claim 39, further comprising automatically adjusting the physical location of a reproducing head based upon the tracking signal.

* * * * *